US005900756A

United States Patent [19]

Drouot

[11] Patent Number: 5,900,756

[45] **Date of Patent: * May 4, 1999**

[54] BIAS CIRCUIT FOR TRANSISTOR OF A STORAGE CELL

[75] Inventor: Sylvie Drouot, Luynes, France

[73] Assignee: SGS-Thomson Microelectronics S.A., Saint Genis, France

[ * ] Notice: This patent issued on a continued prosecution application filed under 37 CFR 1.53(d), and is subject to the twenty year patent term provisions of 35 U.S.C. 154(a)(2).

[21] Appl. No.: 08/767,521

[22] Filed: Dec. 16, 1996

Related U.S. Application Data

[63] Continuation of application No. 08/674,283, Jul. 1, 1996, abandoned, which is a continuation of application No. 08/393,463, Feb. 27, 1995, abandoned.

[30] Foreign Application Priority Data

Feb. 28, 1994 [FR] France .................................. 94 02556

[51] Int. Cl.[6] .......................... H03K 19/017; H03K 5/12; H03K 17/04

[52] U.S. Cl. .......................... 327/170; 327/374; 327/376; 327/389; 327/391; 327/437; 326/20; 326/91

[58] Field of Search .................................... 327/170, 198, 327/390, 374, 376, 383, 389, 391, 434, 437, 537, 545, 546, 589; 326/87, 91, 20

[56] References Cited

U.S. PATENT DOCUMENTS

| | | | |
|---|---|---|---|
| 4,305,009 | 12/1981 | Miyagawa et al. | 326/87 |
| 4,346,310 | 8/1982 | Carter | 327/589 |
| 4,495,425 | 1/1985 | McKenzie | 327/541 |
| 4,639,622 | 1/1987 | Goodwin et al. | 327/589 |
| 4,731,553 | 3/1988 | Van Lehn et al. | 326/87 |
| 4,779,013 | 10/1988 | Tanaka | 327/170 |
| 5,138,190 | 8/1992 | Yamazaki et al. | 327/537 |
| 5,140,194 | 8/1992 | Okitaka | 326/87 |
| 5,192,879 | 3/1993 | Aoki et al. | 326/87 |
| 5,243,231 | 9/1993 | Baik | 327/546 |
| 5,264,743 | 11/1993 | Nakagome et al. | 327/546 |
| 5,500,611 | 3/1996 | Popat et al. | 326/87 |

FOREIGN PATENT DOCUMENTS

| | | | |
|---|---|---|---|
| 452-684 | 10/1991 | European Pat. Off. | 326/87 |
| 0516225 | 12/1992 | European Pat. Off. | G11C 16/06 |
| 2200265 | 7/1988 | United Kingdom | G11C 17/00 |

OTHER PUBLICATIONS

IEEE Journal of Solid–State Circuits, vol. 20, No. 5, Oct. 1985, New York US, pp. 979–985, C. S. Bill "A Temperature–and Process–Tolerant 64K EEPROM".

*Primary Examiner*—Terry D. Cunningham
*Attorney, Agent, or Firm*—Wolf, Greenfield & Sacks, P.C.

[57] ABSTRACT

Disclosed is an integrated circuit comprising storage circuits, these circuits themselves comprising insulation transistors to which a determined positive bias voltage may be applied. This bias voltage is determined by means of a first bias circuit. The disclosed circuit comprises a second bias circuit whose time constant in response to a voltage step is smaller than the time constant of the first circuit in response to the same step, this second circuit making it possible to reduce the response time of the first bias circuit.

11 Claims, 2 Drawing Sheets

READ
PROGRAM
Vcc
Gnd
Vcc/Gnd
VB
VBO

BIAS CIRCUIT FOR TRANSISTOR OF A STORAGE CELL

This application is a continuation of application Ser. No. 08/674,283, filed Jul. 1, 1996, now abandoned which in turn is a continuation of application Ser. No. 08/393,463, filed Feb. 27, 1995, now abandoned.

BACKGROUND OF THE INVENTION

1. Field of the Invention

The invention relates to integrated circuits and more specifically to the making of a bias circuit that can be used to temporarily modify the access to programmable memorizing or storage cells. Such cells are used notably in the field of read-only memories organized in matrix form in which the memorizing or storage cells comprise a floating-gate transistor as a storage unit.

2. Discussion of the Related Art

Read-only memories are commonly organized in matrix form, in rows and columns. The rows are called bit rows. The columns are called word columns. The intersections of these rows and columns form storage cells whose electrical state represents an information element. Depending on the technology used, these storage cells are programmable one or more times, they can be erased individually or comprehensively etc. The programming and the erasure are operations that consist in dictating a certain voltage on these storage cells, the electrical state of these cells being modified as the case may be during these operations.

The rows and the columns of the memories are generally tested when they come off the production line. This testing is done in order to check their operation. What is done notably is to ensure that access can be had to all the storage cells of the memories and that they can be programmed and erased in such a way that there is definite knowledge, at any time, of the electrical state of the storage cells. It happens that certain columns have manufacturing defects. It may be that it is impossible to obtain access to them. It may also happen that the information elements that have to be stored therein are not reliable if, for example, their electrical state remains the same whereas it should have been modified by programming or erasure. In this case, it is preferable not to use them. The common practice, therefore, is to provide for the use of additional columns, called redundancy columns, to overcome any malfunctioning of the columns placed at the disposal of the users. If no malfunctioning is detected when the circuits come off the production line, these redundancy columns are not used.

The number of redundancy columns depends on the maximum space factor allowed, and on the probabilities of malfunctioning which depend on the technological parameters. For example, for a memory comprising 8192 columns organized in 32 blocks of 256 columns, it may be decided to add 4 redundancy columns per block. This gives, in all, 128 redundancy columns.

To make it possible effectively to replace a malfunctioning column by a redundancy column, it is necessary to provide for means to memorize the address of the malfunctioning column and to select the redundancy column when the address of the malfunctioning column is selected. Hitherto, the procedure used was to physically cut off wires, typically by means of lasers. This operation had to be done before the passivation of the memory and necessitated a return to the production line for the passivation once the replacement was done.

Now, in order to simplify the operation, programmable circuits are used for the electrical memorizing, in memorizing circuits, of the addresses of the redundancy columns.

A memorizing circuit typically comprises a floating-gate transistor used as a memorizing point. A floating-gate transistor represents one address bit. This floating-gate transistor, commonly called a fuse, is series-connected with a current source. The expression “fuse” is functional and metaphorical. It does not necessarily entail a melting of material.

Depending on its electrical state (whether or not there are electrons present at the floating gate), the fuse behaves like an open circuit or like a resistor. If it behaves like a resistor, it may be crossed by a current. On the contrary, if it behaves like an open circuit, it cannot be crossed by a current. Addresses of the redundancy columns are therefore read by means of a current detector.

In the example described here above, the addresses are encoded on 13 bits. There are therefore 1664 redundancy column address bits available in all. If a supplementary validation bit is added in order to read only the addresses corresponding to the actually used redundancy columns, it is possible to read up to 1792 bits, each one taking the form of a fuse.

To program a fuse, it is insulated from the corresponding current source. For this purpose, at least one insulation transistor is used, series-connected between this fuse and this current source. When programming is being done, the insulation transistor is cut off and no current goes from the current source to the fuse.

A storage circuit 2 of this type can be recognized in FIG. 1. This figure relates to the invention but also shows the prior art.

A floating-gate transistor 3 (fuse) whose source is connected to a ground 5 is series-connected with an N type transistor 4 whose drain is connected to a supply terminal 6 by means of a resistor 25.

The drain of the floating-gate transistor is connected to a circuit 7 enabling a voltage to be imposed.

This circuit works as follows:

in programming mode, depending on the electrical state desired, a high value (for example 10 volts) is imposed or not imposed on the drain of the floating-gate transistor in order to inject or not inject electrons into the floating gate, its control gate being connected to a ground, and the control gate of the insulation transistor being connected to the ground.

in current passage detection mode (the reading of the address bit), the N type insulation transistor is biased positively at its control gate in order to be on, the control gate of the floating-gate transistor being connected to a positive supply potential VCC given by the supply terminal. The detection is done by a circuit connected to the drain of the insulation transistor.

When the operation is in reading mode, the insulation transistor is on and a current may flow, as the case may be, depending on the electrical state of the floating-gate transistor.

The insulation transistor is used to impose a constant voltage on the drain of the floating-gate transistor to have the same reading conditions whatever the current given by the supply terminal. In this case, the current read is only a function of the threshold voltage of the floating-gate transistor, this threshold voltage varying according to the electrical state of this transistor.

To impose a constant voltage on the drain of the floating-gate transistor, a constant bias voltage is imposed on the insulation transistor. This voltage is typically twice the threshold voltage Vt of an insulation transistor (typically Vt=1V). A low bias voltage is chosen in order to limit the current produced and hence the consumption of the circuit.

This limitation therefore requires the presence of a bias circuit. This bias circuit should also be capable of giving adequate voltage in programming mode (for the connection to the ground of the control gate of the insulation transistors).

It is preferable, for reasons of speed of access time, to carry out the permanent reading of the states of the fuses (at least the states of those representing the addresses of redundancy columns used). This raises a problem of consumption. Indeed, irrespectively of the mode of operation used, the bias circuit must work. This is the case for example in a watch mode wherein the memory is supplied but not used (with no reading and no writing). This bias circuit should therefore work as little as possible. On the other hand, it should be fast during the activation of the memory (when reading and writing are possible).

A present trend is leading towards the development of integrated circuits that work with variable supply voltage values. For example, circuits are being developed that can work as well with a 3-volt supply voltage as with a 5-volt supply voltage. However, the bias circuit should be capable of giving the positive bias voltage at high speed (typically within less than 1 μs). Indeed, after the voltage is turned on or after a programming phase, it may happen that it is sought to gain access to a column that proves to be malfunctioning.

There are known bias circuits that are fast and consume little power, working at 5 volts. However, these circuits are not suitable for low supply voltages (3 volts) because their build-up time in this case is far too unsatisfactory (it is greater than 1 μs). The set of storage circuits may indeed be likened to a capacitor with a capacitance of some picofarads. These bias circuits are therefore not suited for variable supply voltage circuits.

The invention is aimed at proposing an integrated circuit comprising storage circuits such as those defined here above and means to give a bias voltage to the insulation transistors, these means consuming little power for supply voltages of the order of 5 volts and having a response time constant that is relatively fast for supply voltages of the order of 3 volts.

SUMMARY OF THE INVENTION

An object of the invention therefore is an integrated circuit comprising storage circuits, a first bias circuit comprising at least one control terminal to receive a first binary control signal and an output terminal to give a binary bias voltage to the storage circuits, this voltage taking a first value when the first control signal is in a first state and a second value when said control signal is in a second state, wherein said circuit comprises a second bias circuit that includes at least one control terminal to receive a second binary control signal and one output terminal to give a binary bias voltage to the storage circuits, this voltage taking a first value when the second control signal is in a first state and a second value when said second control signal is in a second state, and wherein the time constant of the second circuit in response to a change in state of the second control signal is smaller than the time constant of the first circuit in response to a change in state of the first control signal.

Thus, the invention proposes the use of a first bias circuit of the kind known in the prior art and capable of giving a bias voltage (2 Vt) that is stable and precise, in adding to it a second bias circuit that has a faster response time constant in order to accelerate the response time of the first bias circuit.

This result is achieved preferably by the use of a second bias circuit comprising a series capacitor at output, thus creating a capacitive voltage divider with the equivalent capacitance of the set of storage circuits.

BRIEF DESCRIPTION OF THE DRAWINGS

Other features and advantages of the invention shall appear from the following detailed description of a preferred embodiment, made with reference to the appended drawings, of which.

DETAILED DESCRIPTION

Figure 1:
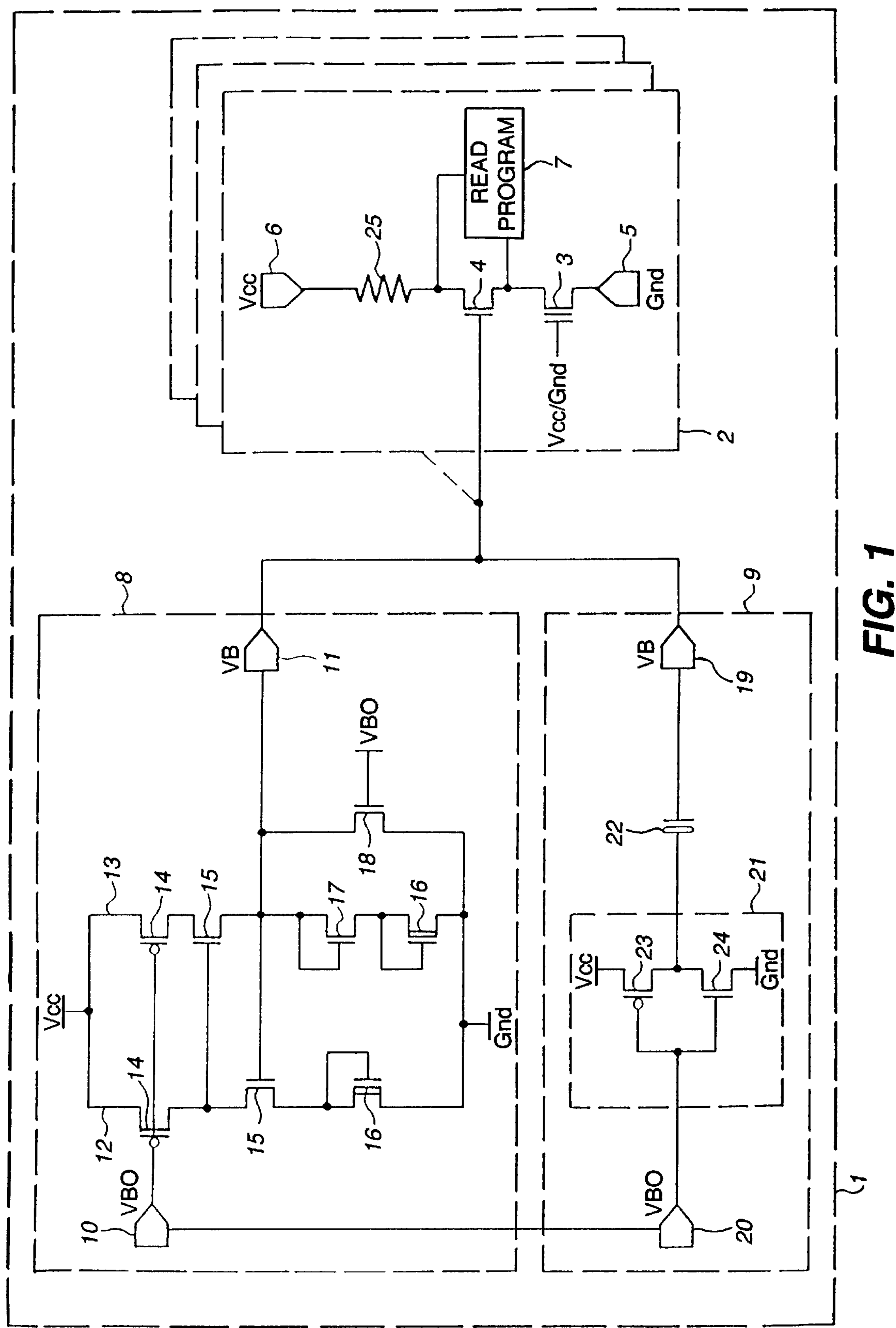
FIG. 1 shows a circuit according to the invention.

FIG. 1 shows an integrated circuit 1 made according to the invention. It may be made in MOS technology. This integrated circuit has storage circuits 2 that are not all represented. These storage circuits 2 have a cell called a fuse. In the example described, a fuse is a floating-gate transistor 3 series-connected with an N type insulation transistor 4 between a reference terminal 5 and a supply terminal 6. Typically, the reference terminal 5 gives a ground potential GND and the supply terminal 6 gives a positive supply potential VCC of the order of some volts (3 to 5 volts).

The floating-gate transistor 3 is connected by its control gate, by means of a circuit (not shown), either to the ground potential GND or to the supply potential VCC. It source is connected to the ground terminal 5 and its drain is connected to the source of the insulation transistor 4. The insulation transistor 4 has its drain connected to a resistor 25 which is itself connected to the supply terminal 6.

The drain of the floating-gate transistor 3 is connected to a programming and reading circuit 7 which is also connected to the drain of the insulation transistor 4. In a first mode called a programming mode, this circuit 7 may give a voltage of some volts to the floating-gate transistor 3, the control gate of this transistor 3 being connected to the ground. In a second mode called a reading mode, this circuit 7 may detect a possible passage of current into the resistor 25 and hence into the floating-gate transistor 3. This passage depends on the electrical state of the floating-gate transistor 3 (namely the presence or non-presence of electrons on the floating gate).

The integrated circuit 1 also has two bias circuits 8 and 9.

The first bias circuit 8, which is known in the prior art, has a control terminal 10 and an output terminal 11. It is formed by two arms consisting of series-connected transistors between the supply terminal 6 and the ground terminal 5.

A first arm 12 has a first P type transistor 14 whose source is connected to the supply terminal 6 and whose drain is connected to the drain of a first N type transistor 15. The source of this first N type transistor 15 is connected to the drain and to the control gate of a second N type transistor 16, mounted as a diode, the source of which is connected to the ground terminal 5.

The second arm 13 of the first bias circuit 8 is similar to the first one except that an additional N type transistor 17 is mounted as a diode between, respectively, the source and the drain of the transistors corresponding respectively to the first and second N type transistors 15 and 16 of the first arm 12.

The control gates of the P type transistors 14 are connected to the control terminal 10.

The control gate of the first N type transistor 15 of the second arm 13 is connected to the drain of the P type transistor 14 of the first arm 12.

The control gate of the first N type transistor 15 of the first arm 12 is connected to the source of the first N type transistor 15 of the second arm 13. This source is also connected to the output terminal 11.

The first bias circuit 8 furthermore includes an N type transistor 18 mounted at the output between the output terminal 11 and the ground terminal 5. This N type output transistor 18 has its control gate connected to the control terminal 10.

The control terminal 10 receives a first binary control signal VB0. The output terminal 11 gives a binary bias voltage VB to the storage circuits 2. This voltage VB takes a first value when the first control signal VB0 is in a first state (VB0=1) and a second value when said control signal VB0 is in a second state (VB0=0).

If Vt designates the threshold voltage of an insulation transistor 4, the first value of VB is equal to the ground potential GND and the second value of VB is also equal to 2*Vt. The first value of VB corresponds to the insulation of the floating-gate transistor 3 of the current source formed by the resistor 25 and the supply terminal 6 (programming mode). The second value of VB corresponds to the connection of the floating-gate transistor 3 to this current source (reading mode).

This first bias circuit 8 is a source of current-controlled voltage (if VB0=0 of course). The P type transistor 14 of the first arm 12 and the first N type transistor 15 of the second arm 13 are equivalent to resistors. For example, if the first N type transistor 15 lets through more current, then there is a drop in voltage in the P type transistor 14 of the first arm 12, hence a drop in the potential of the control gate of the first N type transistor 15 of the second arm 13. The current going through this transistor tends to diminish and the voltage VB drops at the output terminal 11. Thus, by negative feedback, it is ensured that there will be a precise and stable bias voltage VB available.

The transistors 16 and 17 mounted as diodes on the second arm 13 between the output terminal 11 and the ground terminal 5 enable the fixing of the bias voltage VB as a value equivalent to two threshold voltages Vt when VB0=0.

The N type output transistor 18 enables the swift connection of the output terminal 11 to the ground potential GND when the connection between the floating-gate transistors 3 of the storage circuits 2 and the corresponding current sources (VB0=1) is cut. Furthermore, it makes it possible to be sure about the value of the voltage VB present at this time at the output terminal 11. Indeed, it is possible that there might be a floating node at this place by parasitic capacitive effect.

The integrated circuit 1 has a second bias circuit 9. This circuit has an output terminal 19 and a control terminal 20.

The input of an inverter 21 is connected to the control terminal 20. The output of this inverter 21 is connected to the output terminal 19 by means of a capacitor 22.

The inverter 21 is made in a standard way by the series-connection of two respectively P and N type transistors 23 and 24 between a supply terminal 6 and a reference terminal 5.

The control terminal 20 of the second bias circuit receives a second binary control signal VB0. The output terminal 19 of this second bias circuit gives a binary bias voltage VB to the storage circuits 2. This bias voltage VB assumes a first value when the second control signal VB0 is in a first state (VB0=1) and a second value when said second control signal VB0 is in a second state (VB0=0).

In the preferred example described, the output terminal 19 and the control terminal 20 of the second bias circuit 9 are connected to the terminals of the first bias circuit 8. Similarly, the supply terminal 6 and the ground terminal 5, used by the two bias circuits 8 and 9, are identical. It is very easy to conceive of a situation where the two bias circuits 8 and 9 are connected to two supply terminals giving different supply voltages, depending on the bias voltage VB desired at output of the second bias circuit 9.

Schematically, it is possible to represent the bias circuit 8 taken separately by a voltage source series-mounted with an RC circuit. Typically, C equals about ten picofarads if we take the example considered. The first bias circuit 8 is characterized by a time constant t1=RC and a gain G1=VB/VCC=2*Vt/VCC when VB0 goes from the state 1 to the state 0.

With regard to the second bias circuit 9 taken separately, letting C' denote the capacitance of the capacitor 22 placed at output, there is a time constant t2=R*C*C'/(C+C') and a gain G2=VB/VCC=C'/(C+C') when VB0 goes from the state 1 to the state 0.

If k=C'/(C+C'), then t2=k*t1, with k<1.

Taking for example C' as being equal to 5 picofarads, the time constant t2 of the second bias circuit 9 is three times smaller than the time constant t1 of the first bias circuit 8.

We then have G2=⅓. If VCC=5 V, then VB=1.67 V for the second bias circuit taken separately. If VCC=3 V then, under the same conditions, VB=1 V. For the first bias circuit 8 taken separately, the bias voltage VB is constant whether VCC equals 3 or 5 volts, and it is the gain G1 that varies.

An arrangement may be conceived of where C' is increased in order to have available a greater positive bias voltage VB at the output terminal 19 of the second bias circuit 9 taken separately. However, this is not advisable as it would increase t2.

Used together with the first bias circuit 8, the second circuit 9 therefore does not give the bias voltage value (2*Vt) needed for the reading of the floating-gate transistors 3. By contrast, it enables a reduction in the build-up time of the first bias circuit 8. Indeed, the two output terminals 11 and 19 are connected and the output terminal 11 of the first bias circuit 8 sets up a negative feedback at its input.

Initially, when VB0 goes from 1 to 0, the second bias circuit 9 tends to raise the voltage VB to a value equal to G2*VCC, with a time constant t2. As soon as the voltage VB tends to stabilize and hence tends to evolve less speedily than would have been dictated by the first bias circuit 8 alone for an equivalent level of output voltage, the first circuit 8 takes over and raises the output voltage VB to the desired value of 2*Vt.

Figure 2A:
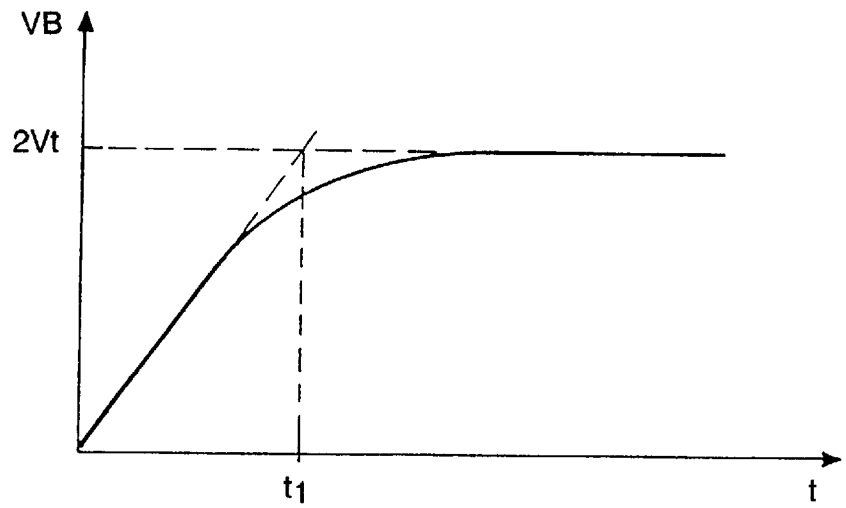
FIGS. 2*a*, 2*b*, 2*c* are timing diagrams representing responses of the bias circuits taken separately or together, in response to a voltage step.

FIG. 2*a* illustrates the temporal evolution of the output voltage VB in response to a step (VB0 going from 1 to 0) in the case of a bias circuit 8 acting alone.

Figure 2B:
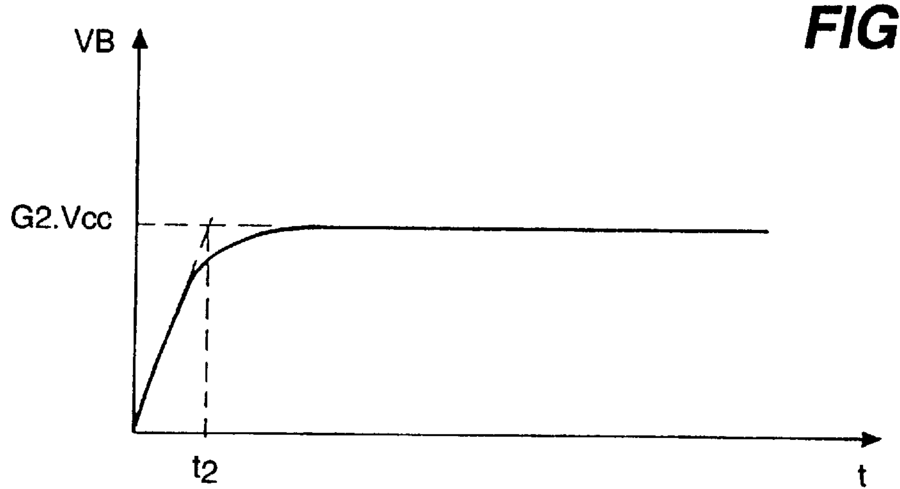

FIG. 2*b* illustrates the temporal evolution of the output voltage VB in response to the same step, if we consider the second bias circuit 9 alone.

Figure 2C:
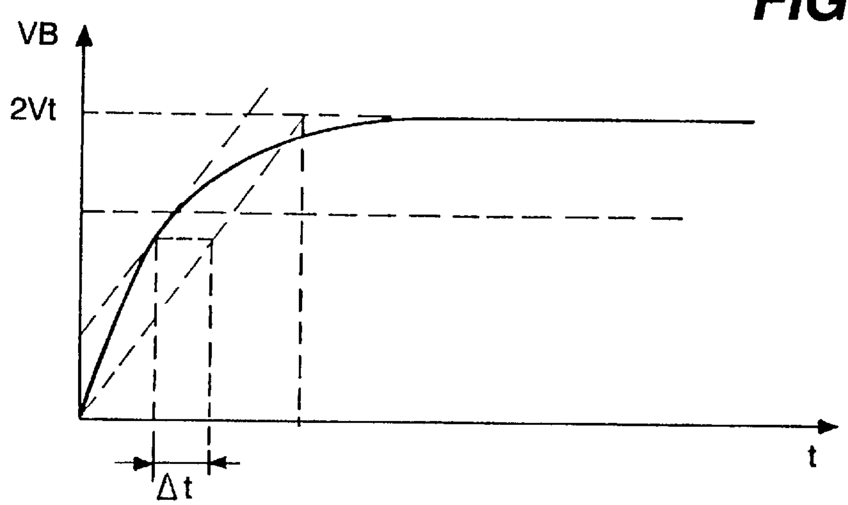

FIG. 2*c* illustrates the evolution of the output voltage when the two bias circuits 8 and 9 are used simultaneously.

The gain in time Δt between FIG. 2*a* and FIG. 2*c* is a function of the time during which the value of the voltage VB is a function of the second bias circuit 9.

Of course, it is possible to envisage another procedure to obtain a second bias circuit 9 having a reduced time constant t2. The second bias circuit 9 as described has the advantage of being compact and consuming little power. It is nevertheless possible to choose to replace the output series capacitor 22 by an equivalent circuit (parallel inductance for example) without going beyond the scope of the invention.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An integrated circuit receiving a binary control signal which transitions from a first state to a second state, for generating, responsive thereto, an output bias voltage, the circuit having power connections for an upper supply voltage and a lower supply voltage, and the circuit comprising:

storage circuits including an isolation transistor having a gate and a floating gate transistor;

a first bias circuit including an input connected to receive the binary control signal and a first bias circuit output, the first bias circuit defined by a response when the first bias circuit output is open circuited of providing a first binary bias voltage transitioning at a first rate from a first value to a second value controlled to be greater than the lower supply voltage and less than and independent of the upper supply voltage when said binary control signal transitions from the first state to the second state the second value controlling a final value of the output bias voltage; and a second bias circuit including an input connected to receive the binary control signal and a second bias circuit output, the second bias circuit defined by a response when the second bias circuit output is connected only to the gate of the isolation transistor of providing a second binary bias voltage transitioning at a second rate faster than the first rate from the first value to a third value when said binary control signal transitions from the first state to the second state; wherein the first bias circuit output and the second bias circuit output are connected together to the gate of the isolation transistor for applying the output bias voltage to the storage circuits, whereby the output bias voltage begins transitioning at the first rate and concludes transitioning at the second rate, responsive to the binary control signal, finally reading the controlled second value.

2. An integrated circuit receiving a binary control signal which transitions from a first state to a second state, the circuit having power connections for an upper supply voltage and a lower supply voltage, and the circuit comprising:

storage circuits including an isolation transistor having a gate and a floating gate transistor;

a first bias circuit including an input connected to receive the binary control signal and a first bias circuit output, the first bias circuit producing a response defined when the first bias circuit output is open circuited of providing a first binary bias voltage, this voltage transitioning at a first rate from a first value to a controlled second value controlled to be greater than the lower supply voltage and less than and independent of the upper supply voltage when said binary control signal transitions from the first state to the second state; and a second bias circuit including an input connected to receive the binary control signal and a second bias circuit output;

wherein the second bias circuit includes, connected in series with the second bias circuit output, a capacitor which, together with the gate of the isolation transistor, cause a response of the second bias circuit to be defined as providing a second binary bias voltage which transitions from a first value to a third value at a second rate faster than the first rate when the binary control signal transitions from the first state to the second state; and wherein an output bias voltage is formed at the gate of the isolation transistor, to which the first bias circuit output and the second bias circuit output are connected, whereby the output bias voltage begins transitioning toward the third value at the second rate and concludes transitioning at the first rate, finally approaching the controlled second value of the first binary bias voltage.

3. A circuit according to claim 2, wherein the second bias circuit includes an inverter series-connected with the capacitor between the input of the second bias circuit and the second bias circuit output.

4. A circuit according to one of the claims 1, 2, and 3, wherein the isolation transistor is an N type transistor.

5. An integrated circuit for selectively biasing a gate of a transistor in a memory cell, the integrated circuit having a binary control signal input and an output selectively carrying an output bias voltage, the integrated circuit further having connections for an upper supply voltage and a lower supply voltage, the integrated circuit comprising:

a first circuit having an input connected to receive the binary control signal and having a first output connected to the gate of the transistor in the memory cell, the first circuit responding to a transition occurring on the binary control signal by forming on the first output a first signal making a relatively fast transition from a first voltage towards a second voltage; and a second circuit having an input connected to receive the binary control signal and having a second output, the second circuit having an open circuit response at the second output to the transition occurring on the binary control signal of forming on the second output a second signal making a relatively slow transition from the first voltage to the output bias voltage, the second circuit controlling a final value of the output bias voltage to lie between the upper supply voltage and the lower supply voltage and to be independent of the upper supply voltage; wherein the second output is also connected to the gate of the transistor in the memory cell, whereby the output bias voltage is formed by an interaction between the first signal and the second signal, the final value of the output bias voltage controlled by the second circuit.

6. The circuit of claim 5, wherein the first signal making the relatively fast transition is capacitively coupled to the gate of the transistor in the memory cell.

7. The circuit of claim 6, the circuit further comprising a CMOS buffer having an output carrying the first signal, the CMOS buffer having an input connected to receive the binary control signal.

8. The circuit of claim 7, wherein the CMOS buffer is an inverter.

9. The circuit of claim 7, wherein the signal making the relatively slow transition is generated by a current-controlled voltage source.

10. A method of biasing a storage circuit to a final bias voltage greater than a lower supply voltage and less than an upper supply voltage, responsive to a binary output signal, the method comprising steps of:

generating a first bias signal which transitions from a first voltage towards a second voltage relatively fast, wherein the first bias signal does not accurately attain the final bias voltage;

generating a second bias signal which transitions from the first voltage to the final bias voltage relatively slow, wherein the second bias signal accurately attains the final bias voltage that is independent of the upper supply voltage; and applying the first and second bias signals to a common circuit node to quickly bias the storage circuit with an accurate bias voltage.

11. The circuit of claim 10, wherein the first bias signal returns to the first voltage, while the second bias signal attains the level of the bias voltage.

* * * * *